United States Patent [19]

Abbott

[11] Patent Number: 5,268,331
[45] Date of Patent: Dec. 7, 1993

[54] STABILIZER/SPACER FOR SEMICONDUCTOR DEVICE LEAD FRAMES

[75] Inventor: Donald C. Abbott, Norton, Mass.

[73] Assignee: Texas Instruments Incorporated, Dallas, Tex.

[21] Appl. No.: 817,712

[22] Filed: Jan. 7, 1992

[51] Int. Cl.$^5$ .............. H01L 21/00; H01L 21/02; H01L 21/31; H01L 21/469

[52] U.S. Cl. .................. 437/225; 437/228; 257/671

[58] Field of Search ............. 437/225, 228; 257/671, 257/687

[56] References Cited

U.S. PATENT DOCUMENTS 4,320,251  3/1982  Narashimhan ............... 437/203
5,087,962  2/1992  DeVos et al. ............... 257/671

Primary Examiner—Brian E. Hearn
Assistant Examiner—B. Everhart
Attorney, Agent, or Firm—Stanton C. Braden; Richard L. Donaldson

[57] ABSTRACT

The invention is to a method for plasma spraying a ceramic or plastic material on selected areas of leads to form stabilizer/spacers for the leads.

8 Claims, 4 Drawing Sheets

STABILIZER/SPACER FOR SEMICONDUCTOR DEVICE LEAD FRAMES

FIELD OF THE INVENTION

This invention relates to semiconductor devices, and more particularly to a ceramic or plastic stabilizer/spacer for devices having high pin count lead frames.

BACKGROUND OF THE INVENTION

In producing delicate, high pin count lead frames with closely spaced inner leads, polyimide or kapton tape is often applied to maintain lead-to-lead spacing and to stabilize lead tip planarity. This operation is typically done after stamping or etching the lead frame and after plating of the lead frame. It involves indexing and precisely locating a lead frame unit and applying heat and pressure to a piece of precisely cut and located polyimide tape to affix it to the lead frame. This operation is expensive, time consuming and subjects the high value added plated lead frame to additional mechanical handling. Ionic contamination is often found in polyimide taped lead frames.

BRIEF SUMMARY OF THE INVENTION

An etched or stamped lead frame strip, either plated or unplated, either cut to length or uncut, is fixed in a jig and a solid mask with windows cut in it is located over the lead frame strip by use of index pins. The mask may be of metal, plastic, cardboard, or other similar materials. The index pins provide precise location of the mask to the lead frame and the mask is clamped in place assuring co-planarity of the leads. If the lead frame is offset, then the jig has pockets cut in it to accommodate the depth of the offset bar pad. The masks windows are cut in such a way as to allow a plastic or ceramic, such as alumina or similar high dielectric strength material, to be deposited on and between the lead fingers. The material applied fixes the relative position of the lead fingers in the X, Y and Z directions. The masking and deposition of the stabilizing material may be done in more than one step and may be done from either or both sides.

If the lead frame has been plated and is uncut, then after application of the stabilizer/spacer, it is ready for offsetting, cutting, and shipping. If the lead frame has been plated, offset and cut, then after application of the stabilizer/spacer, it is ready for shipment.

If the lead frame is unplated, either cut or uncut, then a preceding or subsequent step to applying the ceramic stabilizer/spacer is to fixture the lead frame in a standardized jig, place a mask with windows over the lead frame that defines the area for selective deposition of plasma sprayed metal, such as silver. The fixturing would be same for either the ceramic or metal plasma coating. Only the mask would change.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
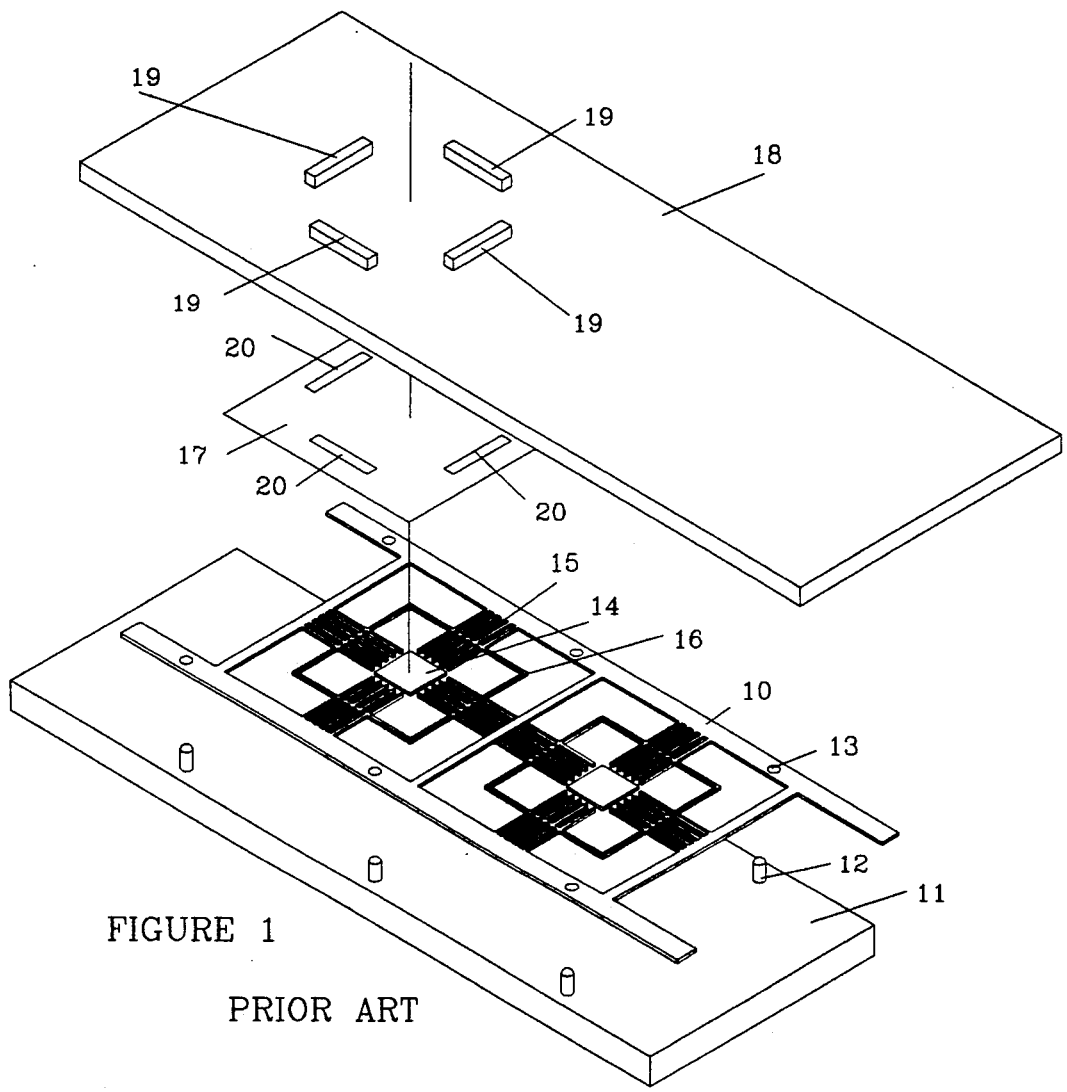
FIG. 1 illustrates a fixture and lead frame illustrating the use of a punch and die to place a prior art polyimide tape on the leads.
Figure 2:
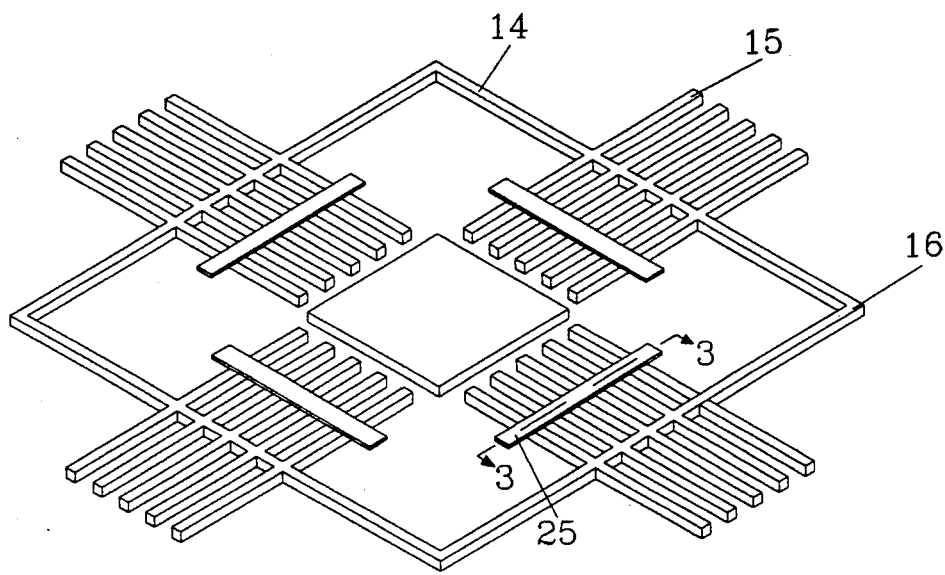
FIG. 2 illustrates a single lead frame with the polyimide stabilizer in place.
Figure 3:
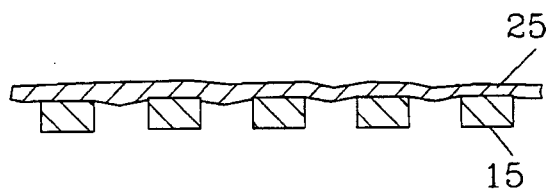
FIG. 3 is a cross-sectional view of the polyimide stabilizer/spacer on the leads.

FIGS. 1, 2 and 3 illustrate a prior art method for providing a stabilizer spacer for lead frame leads in high pin count lead frames. A lead frame 10 having index holes 13 is placed on a heater block 11 having indexing pins 12 hold the lead frame in place on the block. A die 17 having die holes 20 is placed over lead frame 10 such that the die holes 20 span leads 15. A sheet of polyimide 18 is placed over the die and a punch having punch elements 19 corresponding to the openings 20 in die 17 is placed over the polyimide. Punch elements 19 punch small strips of polyimide material out of sheet 18 onto leads 15. FIG. 2 shows the strips 25 of polyimide on leads 15 after the strips 25 have been punched out of sheet 18. FIG. 3 is a cross sectional view of polyimide strips 25 and leads 15. Heat from heater block supply heat to aid in the adhesion of strips 25 to leads 15.

Figure 4:
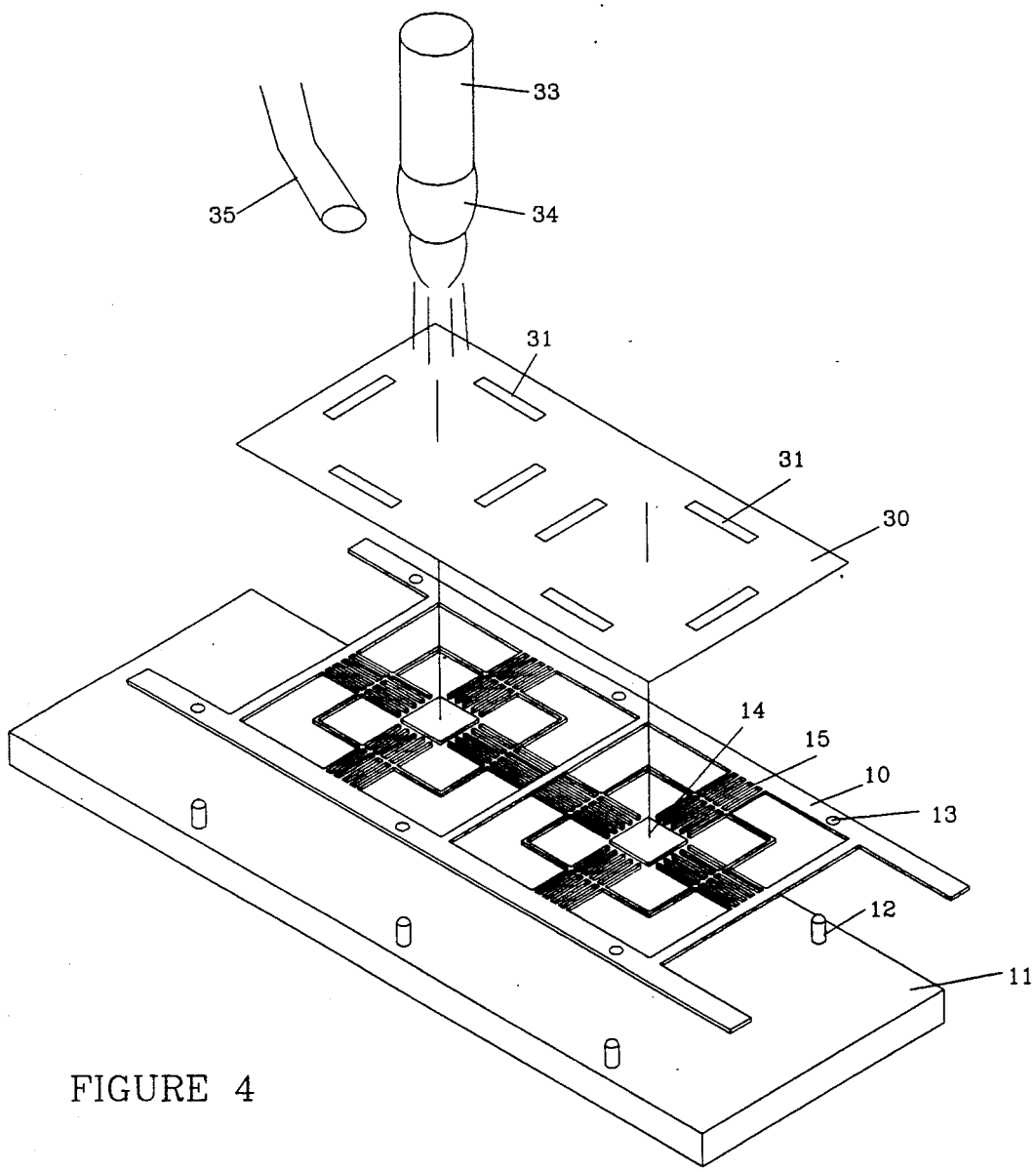
FIG. 4 illustrates the apparatus for applying a coating of material on the lead frame and for forming ceramic or plastic stabilizer/spacer according to the present invention.

FIG. 4 illustrates the method and apparatus of the present invention for plasma spraying a ceramic or plastic material onto the leads of a lead frame to form stabilizer/spacer on the leads. FIG. 4 shows a lead frame 10 which is mounted on jig or fixture 11. Lead frame 10 includes the die mount pad 14, leads 15 held in place by dam bar 16. Dam bar 16 is removed after the semiconductor device has been completed, and after encapsulation. Lead frame 10 is held in placed by index pins 12, on jig or fixture 11, and index holes 13 in the edges of lead frame 10.

A mask 30 is placed over lead frame 10. Mask 30 has a pattern of holes 30 corresponding to the areas on leads 15 that are to be coated with ceramic.

A torch 37 has a flame or plasma 34 into which powered material is sprayed by tube 35. The powdered material is sprayed into the flame and then deposited in molten form on leads 15 through mask openings 31. Plasma torch 37 or fixture/jig 11 is moved in X-Y directions to place the openings 31 in mask 30 under the plasma torch during the depositions of the ceramic or plastic material to ensure an adequate coating at the desired places.

Figure 5:
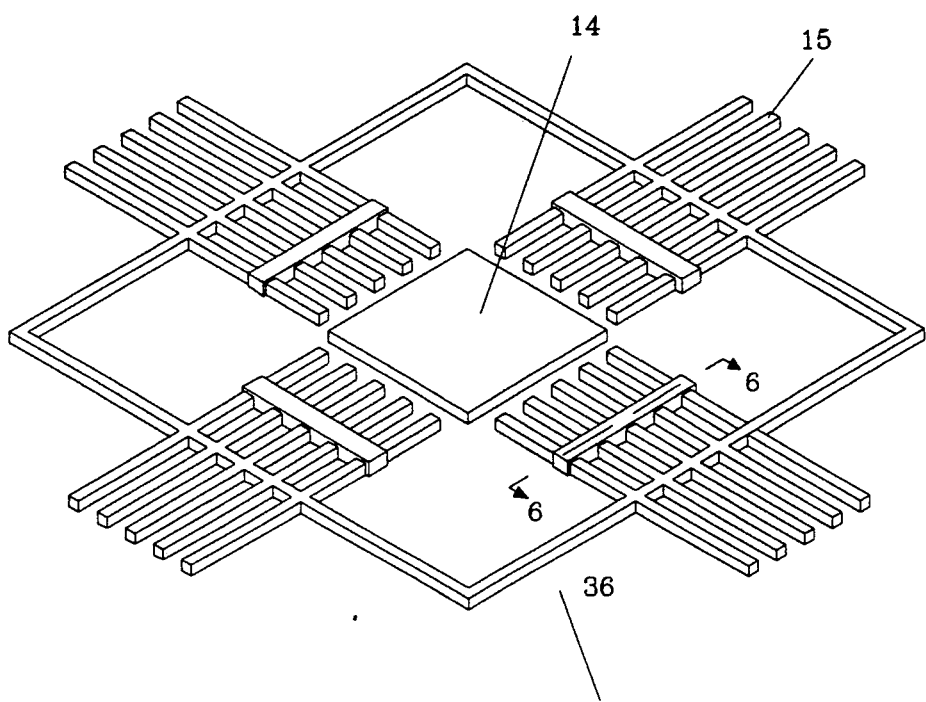
FIG. 5 shows a single lead frame with a ceramic stabilizer/spacer according to the present invention.

FIG. 5 illustrates the lead frame after it has been removed from the side rails, and after deposition of the ceramic stabilizer/spacer 36. Stabilizer/spacer 36 bridges the leads 15 and also is between the leads, holding them in a spaced relationship to each other. Stabilizer/spacer 36 may be on only one side of the leads, as illustrated, or may be on both sides of the leads.

Figure 6:
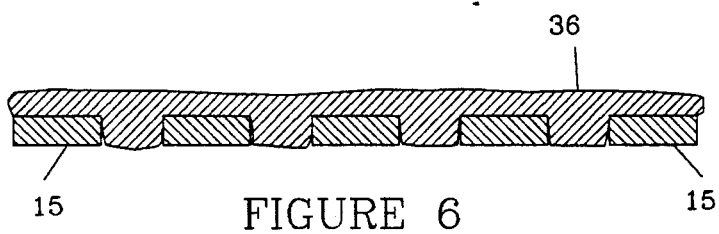
FIG. 6 is a cross-sectional view of the ceramic stabilizer/spacer on the lead of the lead frame.

FIG. 6 is a cross-sectional view of stabilizer/spacer 36 and leads 15, showing the flow of ceramic material between the leads. The ceramic material may be, for example alumina or plastic material. The use of ceramic material instead of polyimide provides an improved hermeticity of plastic lead frame packages. Plastic mold compound adheres to ceramic better that to polyimide tape or lead frame base metal. Plastic materials may also be used. Plastic materials such as those generally known as polyphenylsulfones.

Selective deposition of other metals, such as silver, may be applied in selected areas of the lead frame in a similar manner as applying the ceramic. This selective metal deposition may be applied in the same fixture using plasma deposition either before or after the ceramic deposition, using different masks.

The process illustrated shows cut strips of lead frames, but continuous strips of lead frames may be used.

A continuous pattern of ceramic material may be deposited around the die pad on the leads. Using a continuous pattern provides a continuous seal of plastic encapsulating material to ceramic, providing a better seal around the package.

What is claimed is:

1. A method for providing a stabilizer/spacer for leads of a semiconductor device lead frame having a plurality of leads and a semiconductor die pad, comprising the steps of:
   masking selected adjacent areas on the leads; and
   plasma spraying a stabilizing material onto and between the selected adjacent areas on the leads.

2. The method according to claim 1, including the step of:
   selectively plating the leads prior to the application of the stabilizing material.

3. The method according to claim 1, wherein the stabilizing material is a ceramic material.

4. The method according to claim 1, wherein the stabilizing material is a plastic material.

5. The method according to claim 1, including the step of:
   selectively plating the leads after the application of the ceramic material.

6. The method according to claim 1, including the step of:
   moving the lead frame in X-Y directions to place the selected areas on the leads under the plasma torch during deposition of the ceramic material on the selected areas.

7. The method according to claim 1, including the step of depositing stabilizing material on second selected areas on said leads opposite said selected areas.

8. The method according to claim 1, including the step of plasma spraying ceramic material across all the leads of the lead frame in an enclosed pattern surrounding the die pad.

* * * * *